(12) United States Patent
Wang

(10) Patent No.: US 8,878,556 B2
(45) Date of Patent: Nov. 4, 2014

(54) SENSING DEVICE AND METHOD

(75) Inventor: Cheng-Chih Wang, Zhubei (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 688 days.

(21) Appl. No.: 13/267,107

(22) Filed: Oct. 6, 2011

(65) Prior Publication Data

US 2012/0133376 A1 May 31, 2012

(30) Foreign Application Priority Data

Nov. 25, 2010 (TW) .............................. 99140814 A

(51) Int. Cl.
*G01R 27/26* (2006.01)
*H03K 17/96* (2006.01)
*G01D 5/24* (2006.01)
*G06F 3/044* (2006.01)
*G06F 3/041* (2006.01)

(52) U.S. Cl.
CPC ................ *H03K 17/962* (2013.01); *G01D 5/24* (2013.01); *G06F 3/044* (2013.01); *G06F 3/0416* (2013.01); *H03K 2217/960725* (2013.01); *H03K 2217/960745* (2013.01)
USPC .......................................... 324/686; 324/658

(58) Field of Classification Search
CPC ......... G01D 5/24; G06F 3/0416; G06F 3/044; H03K 17/962; H03K 2217/960725; H03K 2217/960745
USPC ................................................ 324/658, 686
See application file for complete search history.

(56) References Cited

U.S. PATENT DOCUMENTS

| 6,377,129 B1 | 4/2002 | Rhee et al. |
| 6,583,676 B2 * | 6/2003 | Krah et al. ...................... 331/74 |
| 7,307,485 B1 | 12/2007 | Snyder et al. |

(Continued)

FOREIGN PATENT DOCUMENTS

| CN | 1630822 A | 6/2005 |
| CN | 201302712 Y | 9/2009 |

(Continued)

OTHER PUBLICATIONS

English translation of abstract of TW 201007536 A (published Feb. 16, 2010).

(Continued)

*Primary Examiner* — Patrick Assouad
*Assistant Examiner* — Hoang X Nguyen
(74) *Attorney, Agent, or Firm* — McClure, Qualey & Rodack, LLP

(57) ABSTRACT

A sensing device includes an oscillator, a driver, a switch, a counter and a timer. The oscillator includes an input coupled to a reference capacitor. The driver alternately sources and sinks current in accordance with an oscillation signal outputted by the oscillator. The switch connects or disconnects the reference capacitor with a sensing capacitor. The counter counts value for the oscillation signal. The timer counts operation periods respectively when the switch connects the reference capacitor with the sensing capacitor and when the switch disconnects the reference capacitor with the sensing capacitor, and the counter counts values corresponding to conditions of the switch connecting and disconnecting the reference capacitor with the sensing capacitor during the operation periods, respectively.

16 Claims, 4 Drawing Sheets

(56) References Cited

U.S. PATENT DOCUMENTS

| | | | |
|---|---|---|---|
| 8,159,462 B1 * | 4/2012 | Seguine | 345/173 |
| 8,599,169 B2 * | 12/2013 | Nascimento | 345/174 |
| 2007/0229468 A1 | 10/2007 | Peng et al. | |
| 2007/0257894 A1 | 11/2007 | Philipp | |
| 2008/0036473 A1 * | 2/2008 | Jansson | 324/678 |
| 2009/0009195 A1 | 1/2009 | Seguine | |
| 2009/0243632 A1 | 10/2009 | Ozawa | |
| 2010/0271330 A1 | 10/2010 | Philipp | |
| 2011/0074445 A1 * | 3/2011 | Nascimento | 324/676 |

FOREIGN PATENT DOCUMENTS

| | | |
|---|---|---|
| CN | 101853099 A | 10/2010 |
| CN | 101900574 A | 12/2010 |
| JP | H0514164 A | 1/1993 |
| TW | 114320 | 6/1989 |
| TW | 200805128 A | 1/2008 |
| TW | 201007536 A | 2/2010 |

OTHER PUBLICATIONS

English translation of abstract of TW 200805128 A (published Jan. 16, 2008).

English translation of abstract of CN 201302712 Y (published Sep. 2, 2009).

English translation of abstract of CN 101900574 A (published Dec. 1, 2010).

English translation of abstract of CN 101853099 A (published Oct. 6, 2010).

English translation of abstract of CN 1630822 A (published Jun. 22, 2005).

English translation of abstract of JP H0514164 A (published Jan. 22, 1993).

English translation of claims of TW 114320 (published Jun. 1, 1989).

* cited by examiner

SENSING DEVICE AND METHOD

RELATED APPLICATIONS

This application claims priority to Taiwan Patent Application Serial Number 99140814, filed Nov. 25, 2010, which is herein incorporated by reference.

BACKGROUND

1. Technical Field

The present disclosure relates to a sensing device. More particularly, the present disclosure relates to a capacitive sensing device.

2. Description of Related Art

For high technology nowadays, user interfaces of more and more electronic products have already employed touch panels, such that demands for touch sensing devices have increasingly matured. Touch sensing devices have already become the basis of any kind of user interface, and replacing touch sensing interface with traditional keyboard interface undoubtedly makes the user interface become more intuitional and easier for use.

Moreover, one of ordinary skill in the art can use the touch sensing interface to substitute mechanical keys necessary in various applications such as access control, mobile phone, MP3 player, personal computer peripherals, remote controller, etc., and costs for manufacturing products can thus be saved.

For a conventional capacitive sensing device, it usually needs two or more than two oscillators cooperated with each other such that a sensed capacitance variation can be detected according to the difference between frequencies of signals generated by the oscillators, to further sense a user's touch.

However, the manner mentioned above not only needs two or more than two oscillators, but also requires that operational characteristics of the oscillators have to be very consistent, otherwise inaccuracy will be easily generated to cause detection errors. Furthermore, using multiple oscillators not only makes circuits more complicated but also occupies a large circuit area and results in increase of costs.

SUMMARY

In accordance with one embodiment of the present invention, a sensing device is provided. The sensing device includes an oscillator, a driver, a switch, a counter and a timer. The oscillator includes an input and an output, and the input is coupled to a reference capacitor. The driver is coupled to the input and the output of the oscillator and the reference capacitor, and alternately sources and sinks current in accordance with an oscillation signal outputted by the oscillator. The switch is disposed between the reference capacitor and a sensing capacitor and configured to connect or disconnect the reference capacitor with the sensing capacitor. The counter is coupled to the output of the oscillator and configured to count value for the oscillation signal. The timer is coupled to the counter and configured to count operation periods respectively when the switch connects the reference capacitor with the sensing capacitor and when the switch disconnects the reference capacitor with the sensing capacitor, and the counter is configured to count values corresponding to conditions of the switch connecting and disconnecting the reference capacitor with the sensing capacitor during the operation periods, respectively.

In accordance with another embodiment of the present invention, a sensing method used in a sensing device is provided. The sensing device includes an oscillator and a driver. An input of the oscillator is coupled to a reference capacitor. The driver is coupled to the reference capacitor and an output of the oscillator and alternately sources and sinks current in accordance with an oscillation signal outputted by the oscillator. The sensing method includes the steps of disconnecting the reference capacitor with a sensing capacitor, counting value for the oscillation signal under the condition of the reference capacitor being disconnected with the sensing capacitor, counting time period while counting value for the oscillation signal to obtain an operation period, connecting the reference capacitor with the sensing capacitor after the operation period being obtained, counting value for the oscillation signal during the operation period under the condition of the reference capacitor being connected with the sensing capacitor, and reading a value counted under the condition of the reference capacitor being connected with the sensing capacitor during the operation period to detect corresponding voltage variations of the input of the oscillator to determine variations of the conditions of the reference capacitor being connected and disconnected with the sensing capacitor.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiments, with reference to the accompanying drawings as follows.

DESCRIPTION OF THE EMBODIMENTS

In the following description, several specific details are presented to provide a thorough understanding of the embodiments of the present invention. One skilled in the relevant art will recognize, however, that the present invention can be practiced without one or more of the specific details, or in combination with or with other components, etc. In other instances, well-known implementations or operations are not shown or described in detail to avoid obscuring aspects of various embodiments of the present invention.

The terms used in this specification generally have their ordinary meanings in the art and in the specific context where each term is used. The use of examples anywhere in this specification, including examples of any terms discussed herein, is illustrative only, and in no way limits the scope and meaning of the invention or of any exemplified term. Likewise, the present invention is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
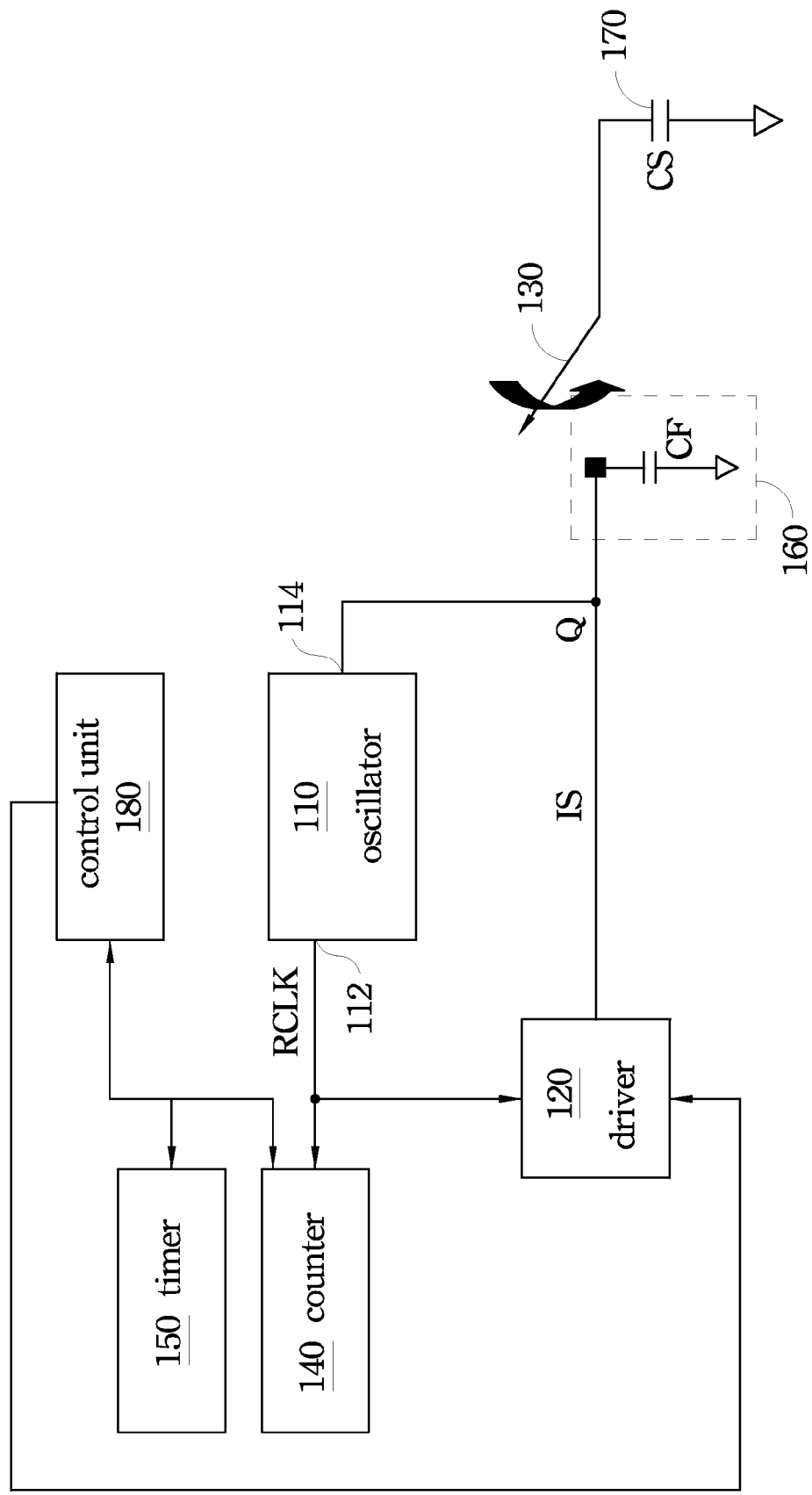
FIG. 1 is a diagram of a sensing device according to one embodiment of the present invention.

FIG. 1 is a diagram of a sensing device according to one embodiment of the present invention. The sensing device at least includes an oscillator 110, a driver 120, a switch 130, a counter 140 and a timer 150.

The oscillator 110 includes an input 114 and an output 112, in which the input 114 of the oscillator 110 is coupled to a reference capacitor 160 at a node Q, and the output 112 of the oscillator 110 outputs an oscillation signal RCLK (e.g. clock signal). It should be noticed that the reference capacitor 160 can be realized by a single capacitor or by multiple capacitors connected in parallel, in series or in combination of parallel and series, so as to form an effective capacitance CF, and thus the reference capacitor 160 is not limited to that shown in FIG. 1.

The driver 120 is coupled to the input 114 and the output 112 of the oscillator 110 and the reference capacitor 160, and operates in accordance with the oscillation signal RCLK outputted by/from the oscillator 110, so as to alternately source and sink the current IS. In practice, the driver 120 may include a controllable current source or any circuit which is capable of providing a controllable current source.

Figure 2:
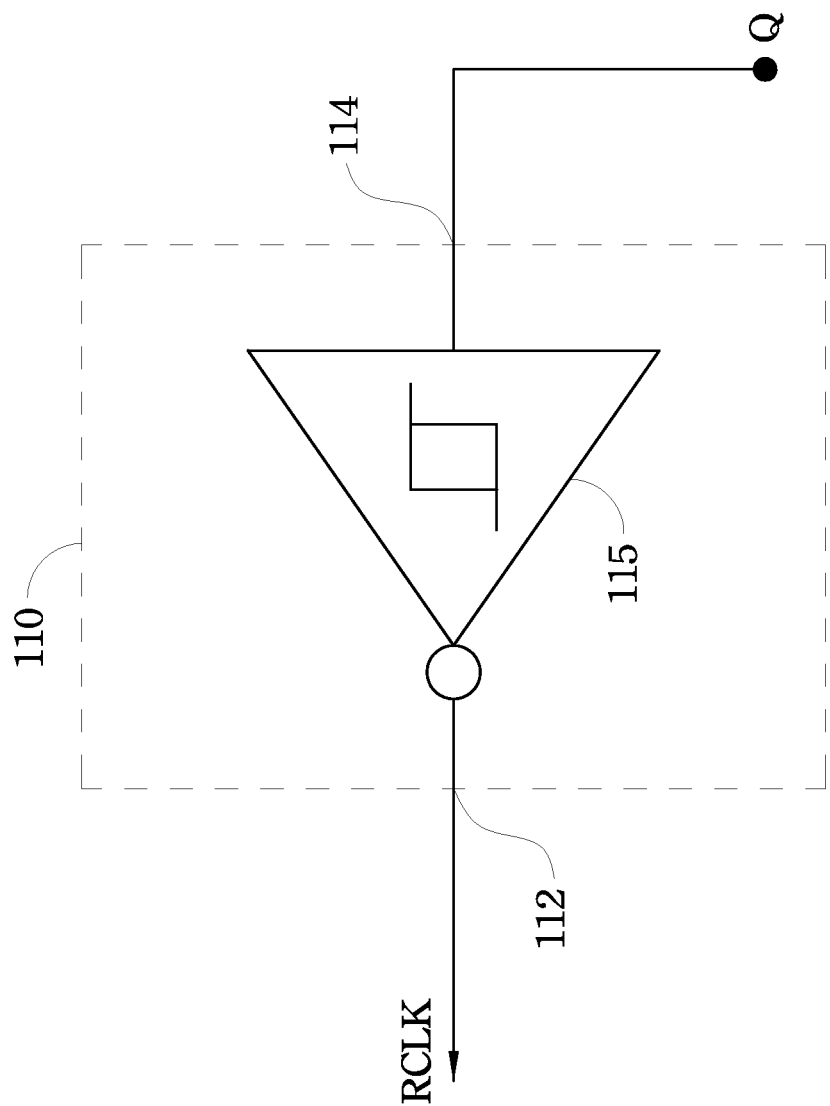
FIG. 2 is a circuit diagram of the oscillator shown in FIG. 1.

In operation, the driver 120 sources the current IS to the node Q in accordance with the oscillation signal RCLK outputted by/from the oscillator 110, for charging the reference capacitor 160. When the voltage drop of the reference capacitor 160, e.g. voltage of the node Q, increases from a ground voltage or zero voltage to a preset voltage due to the charging operation, the oscillator 110 outputs the corresponding oscillation signal RCLK in accordance with the voltage drop of the reference capacitor 160, to control the driver 120, such that the driver 120 sinks the current IS from the node Q, for discharging the reference capacitor 160 so that the voltage drop of the reference capacitor 160 decreases from the preset voltage to the ground voltage or zero voltage due to the discharging operation. Then, the aforesaid process is repeated. In practice, a relaxation oscillator (RO) may be used to implement the oscillator 110, the driver 120, the reference capacitor 160, and the operation therebetween mentioned above. In addition, the foregoing oscillator 110 can be implemented by a Schmitt trigger inverter (e.g. element 115 as shown in FIG. 2), a comparator with characteristics of hysteresis or any voltage comparing circuit capable of generating high/low voltage.

The switch 130 is disposed between the reference capacitor 160 and a sensing capacitor 170 and configured to connect or disconnect the reference capacitor 160 with the sensing capacitor 170. In operation, the switch 130 performs switching repeatedly, such that the sensing device 100 can perform real-time detection. In one embodiment, the switch 130 can be controlled by a control unit 180 mentioned below, to perform switching operation, but is not limited thereto. Likewise, the sensing capacitor 170 can be realized by a single capacitor or by multiple capacitors connected in parallel, in series or in combination of parallel and series, so as to form an effective capacitance CS, and thus the sensing capacitor 170 is not limited to that shown in FIG. 1. The sensing capacitor 170 can be disposed inside or outside the sensing device 100, and the reference capacitor 160 can be disposed inside or outside the sensing device 100 according to practical needs.

The counter 140 is coupled to the output 112 of the oscillator 110 and configured to receive the oscillation signal RCLK to count value for the oscillation signal RCLK. For example, the counter 140 may count time periods of the oscillation signal RCLK or times of changing between low voltage level and high voltage level of the oscillation signal RCLK. In other words, within the spirit and scope of the appended claims, any person skilled in the art may modify or adjust the manner to meet the need of performing counting value in practice.

The timer 150 is coupled to the counter 140 and configured to count operation periods respectively when the switch 130 connects the reference capacitor 160 with the sensing capacitor 170 and when the switch 130 disconnects the reference capacitor 160 with the sensing capacitor 170. The counter 140 counts values corresponding to conditions of the switch 130 connecting and disconnecting the reference capacitor 160 with the sensing capacitor 170, or corresponding to the oscillation signals RCLK under the conditions thereof, during the operation periods, respectively.

Furthermore, the sensing device 100 may further include a control unit 180. The control unit 180 can be a processor, a controller, a micro-controller or other controlling single chips or units. The control unit 180 is coupled to the counter 140 and the timer 150 and configured to read the value which is corresponding to the condition of the switch 130 connecting the reference capacitor 160 with the sensing capacitor 170 and counted by the counter 140 during the operation period, so as to detect corresponding voltage variations of the input 114 of the oscillator 110 to determine variations of the conditions of the reference capacitor 160 being connected and disconnected with the sensing capacitor 170.

As a result, when users perform touch sensing operation such that the effective capacitance CS of the sensing capacitor 170 is generated and the sensing capacitor 170 is alternately connected and disconnected with the reference capacitor 160 by the switch 130 performing switching operation repeatedly to further generate corresponding capacitance variations, the input 114 of the oscillator 110 would have corresponding voltage variations accordingly, and the oscillation signal RCLK outputted by the oscillator 110 would also have variations (e.g. period of signal becoming decreased). At the moment, corresponding capacitance or voltage variations can be detected by reading values of the counter 140. Then, execution programs corresponding to the touch sensing operation are further performed in accordance with the capacitance or voltage variations.

Figure 3:
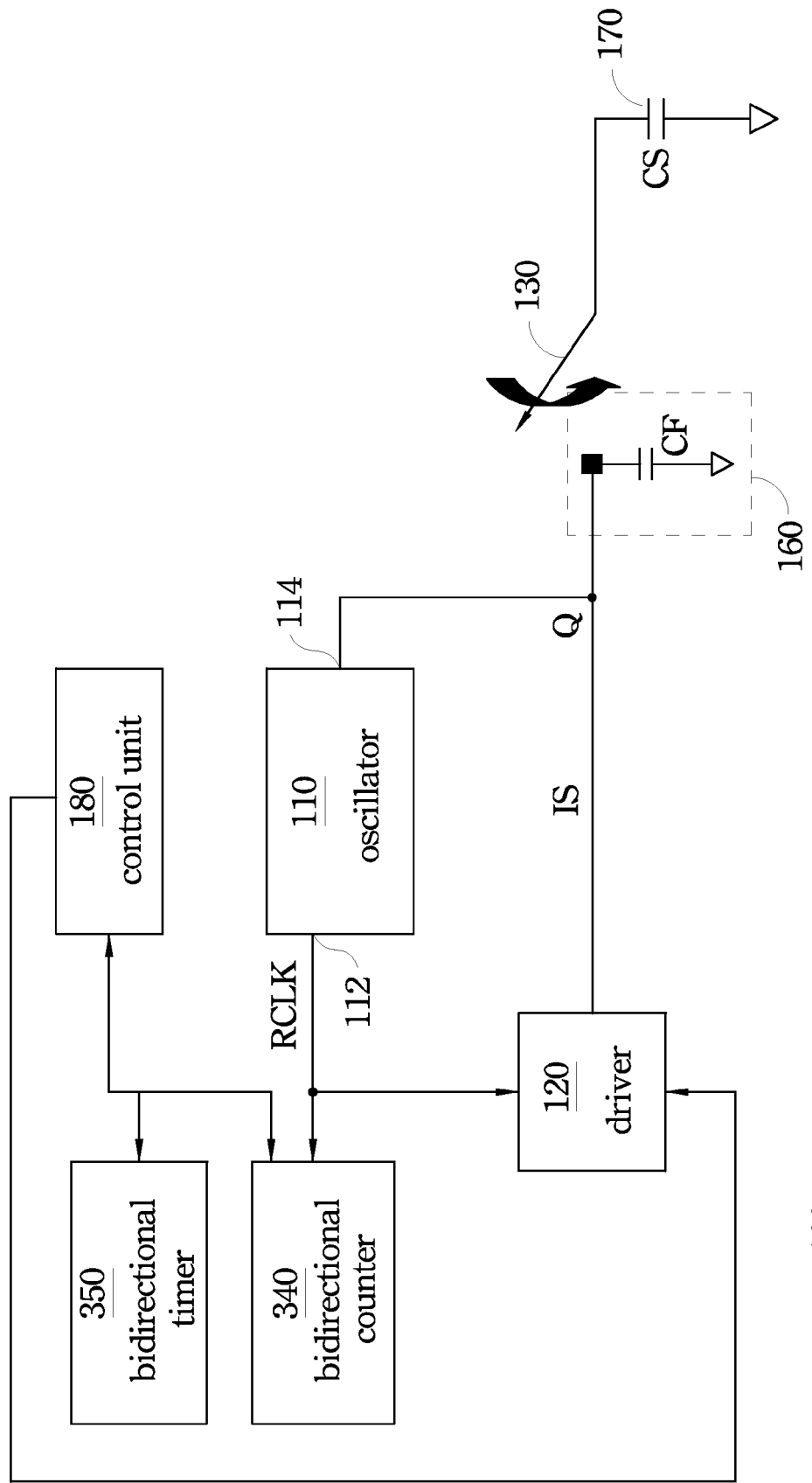
FIG. 3 is a diagram of the sensing device according to another embodiment of the present invention.

FIG. 3 is a diagram of the sensing device according to another embodiment of the present invention. Compared to the sensing device 100 shown in FIG. 1, the sensing device 300 in the present embodiment adopts a bidirectional counter 340 and a bidirectional timer 350.

In the present embodiment, when the switch 130 disconnects the reference capacitor 160 with the sensing capacitor 170, the bidirectional timer 350 can count up an operation period according to the value counted by the bidirectional counter 340. Specifically, while the bidirectional counter 340 counts up, the bidirectional timer 350 also counts up, and the bidirectional timer 350 times out when the bidirectional counter 340 counts up to a maximum value. At that moment, the period counted by the bidirectional timer 350 is defined as an operation period. After that, when the switch 130 connects the reference capacitor 160 with the sensing capacitor 170, the bidirectional timer 350 counts down a same operation period, and the bidirectional counter 340 can count down based on the operation period defined above. In other words, the bidirectional counter 340 can count down continuously for an operation period.

In one embodiment, when the switch 130 disconnects the reference capacitor 160 with the sensing capacitor 170, the bidirectional counter 340 counts from a first value up to a second value during the foregoing operation period; on the other hand, when the switch 130 connects the reference capacitor 160 with the sensing capacitor 170, the bidirectional counter 340 counts from the second value down to a third value during the foregoing operation period, in which the third value can be equal to or larger than the first value.

In practice, when the switch 130 connects the reference capacitor 160 with the sensing capacitor 170, the effective capacitance CS of the sensing capacitor 170 is not entirely equal to 0 even if there is no touch sensing operation, so in fact the third value would still be larger than the first value, and in general the difference therebetween can be used as a background value, in which the background value can be memorized by the control unit 180 for determination of following touch sensing operations. Thereafter, when the effective capacitance CS has a certain level of variation, the control unit 180 can determine if the variation of the effective capacitance CS is larger than the background value. If so, it is determined that the touch sensing operation occurs. Therefore in practice, under the condition of the third value being larger than the first value, it is still necessary that the third value and the first value have a difference of appropriate preset value therebetween to represent the occurrence of the touch sensing operation.

Moreover, since the period or frequency of the oscillation signal RCLK may vary along with the capacitances of the reference capacitor 160 and the sensing capacitor 170 and the value of the current IS, the aforementioned third value may increase correspondingly when the capacitance of the sensing capacitor 170, generated along with the touch sensing operation, increases.

For example, when the switch 130 disconnects the reference capacitor 160 with the sensing capacitor 170, the bidirectional timer 350 counts up an operation period, and the bidirectional counter 340 counts from 0 up to the maximum value (e.g. value $2^N$, N is a positive integer) during the operation period; then, when the switch 130 connects the reference capacitor 160 with the sensing capacitor 170, the bidirectional timer 350 counts down the same operation period. At the moment, the bidirectional counter 340 counts value in accordance with the effective capacitance variation of the reference capacitor 160 together with the sensing capacitor 170, or in accordance with the corresponding voltage variation of the input 114 of the oscillator 110.

If the capacitance of the sensing capacitor 170 approaches to 0, the effective capacitance of the reference capacitor 160 together with the sensing capacitor 170 approaches to the original effective capacitance CF of the reference capacitor 160, and the bidirectional counter 340 counts from the value $2^N$ down to 0 (in ideal) during the operation period of the bidirectional timer 350 counting down. On the other hand, if the capacitance of the sensing capacitor 170 is not approaching to 0, the effective capacitance of the reference capacitor 160 together with the sensing capacitor 170 is larger than the original effective capacitance CF of the reference capacitor 160, and the bidirectional counter 340 counts from the value $2^N$ down to a value larger than 0 during the operation period of the bidirectional timer 350 counting down, and the value which is larger than 0 may increase correspondingly when the capacitance of the sensing capacitor 170 increases.

Furthermore, in one embodiment, the operations of the bidirectional counter 340 and the bidirectional timer 350 can be controlled by the control unit 180. In other words, the control unit 180 can be configured to control the bidirectional timer 350 to count up an operation period in accordance with the value counted by the bidirectional counter 340 and configured to control the bidirectional counter 340 to count down based on aforementioned operation period.

The control unit 180 may further be configured to set a maximum countable value of the bidirectional counter 340 and a maximum countable period of the bidirectional timer 350. In other words, the control unit 180 can be implemented by a programmable chip or integrated circuit (IC), and the maximum countable value of the bidirectional counter 340 and the maximum countable period of the bidirectional timer 350 can be set by the process of the control unit 180 performing programming operation. As a result, the sensitivity or resolution of the sensing device 100 during the detection operation can be enhanced by increasing the maximum countable value and by extending the maximum countable period.

Notably, the bidirectional counter 340 and the bidirectional timer 350 shown in FIG. 3 are only the embodiment of the present invention. Any person skilled in the art may modify the counter 140 and the timer 150 shown in FIG. 1 to meet the need of practical design within the spirit and scope of the appended claims. In other words, the counter 140 shown in FIG. 1 can be realized by an up-count counter, a down-count counter or any type of counter, and the timer 150 shown in FIG. 1 can be realized by an up-count timer, a down-count timer or any type of timer. The present disclosure is not limited to FIG. 3.

Figure 4:
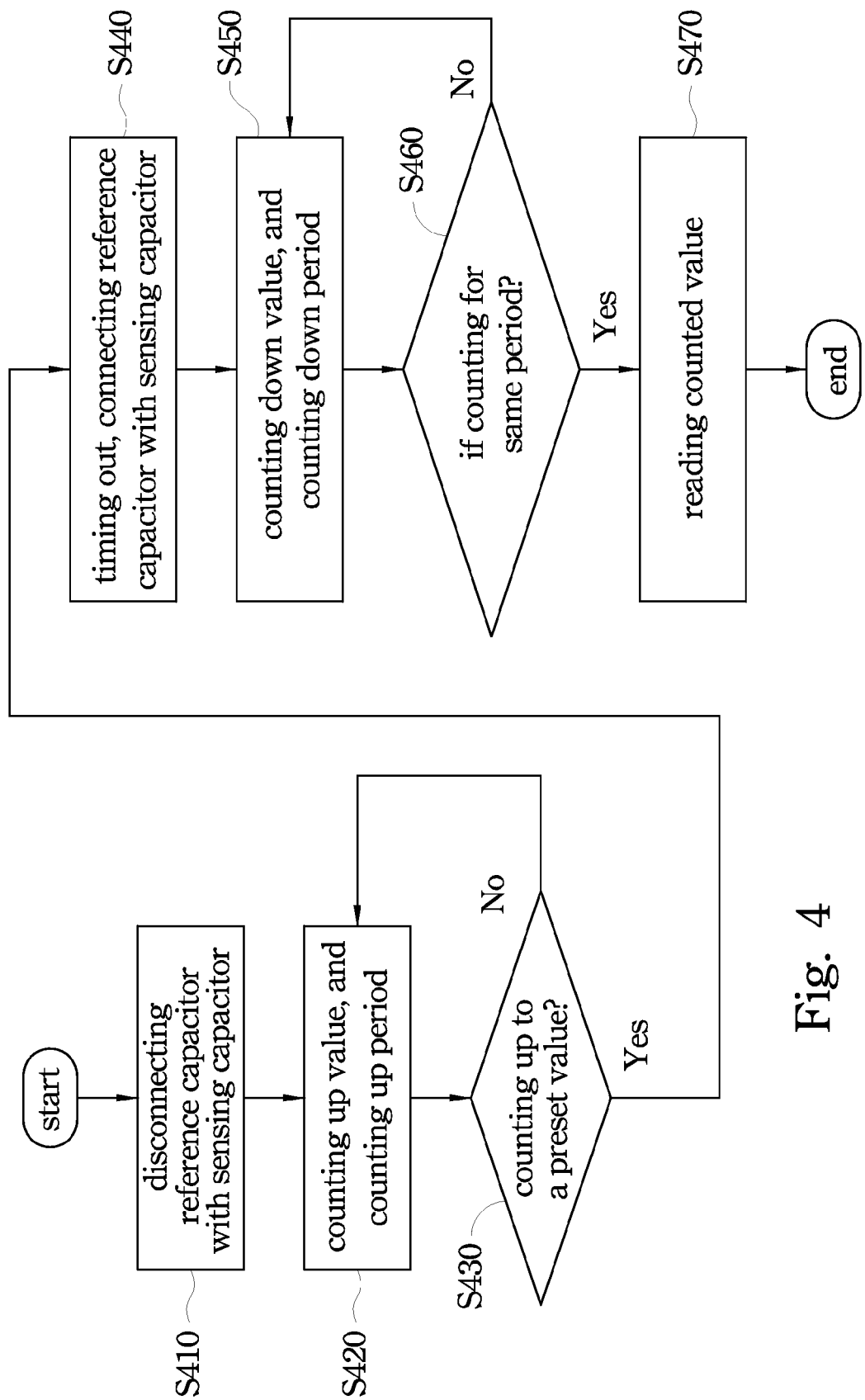
FIG. 4 is a flowchart of a sensing method according to one embodiment of the present invention.

In addition to the aforesaid disclosure, another embodiment of the present invention is related to a sensing method provided for detecting the touch sensing operation. FIG. 4 is a flowchart of a sensing method according to one embodiment of the present invention. The sensing method in the present embodiment can be applied in the sensing device as shown in FIG. 1 or FIG. 3. In order to conveniently describe the present embodiment, the sensing device 300 shown in FIG. 3 together with the flowchart of the sensing method shown in FIG. 4 are explained as follows. Notably, the following steps are not recited in the sequence in which the steps are performed. That is, unless the sequence of the steps is expressly indicated, the sequence of the steps is interchangeable, and all or part of the steps may be simultaneously, partially simultaneously, or sequentially performed. The flowchart of the sensing method shown in FIG. 4 is only one embodiment but not used to limit the present disclosure.

First, the reference capacitor 160 is disconnected with the sensing capacitor 170 (S410), in which the step of disconnecting the reference capacitor 160 with the sensing capacitor 170 can be realized by the switch 130. Moreover, in the step S410, the bidirectional counter 340 and the bidirectional timer 350 can first be reset, so as to clear originally existed value and period therein, and the bidirectional counter 340 and the bidirectional timer 350 can be set respectively under the up-counting mode.

After that, the value is counted up for the oscillation signal RCLK under the condition of the reference capacitor 160 being disconnected with the sensing capacitor 170, and the time period is counted up while counting the value for the oscillation signal RCLK, to obtain an operation period (S420). The step S420 can be performed by the bidirectional counter 340 and the bidirectional timer 350.

Afterwards, if the value is counted up to the preset value or not (e.g. the maximum value) is determined (S430). If the value is not counted up to the preset value, the process is returned back to the step S420 to continue counting value and period. In contrary, if the value is counted up to the preset value, the next step of timing out and connecting the reference capacitor 160 with the sensing capacitor 170 are performed (S440). The foregoing period of counting up to the preset value can be defined as an operation period, and the operation period can be an elapsed period of counting from 0 up to a maximum value under the condition of counting up value. The step S440 can be performed by the bidirectional counter 340 and the bidirectional timer 350, and the bidirectional counter 340 and the bidirectional timer 350 can be set respectively under the down-counting mode.

Moreover, the period is counted down under the condition of the reference capacitor 160 being connected with the sensing capacitor 170, while counting down the value for the oscillation signal RCLK (S450), in which the step S450 may include the step of counting down the value based on the defined operation period, i.e. counting down the value continuously for the operation period.

Thereafter, if the period is counted down continuously for the same operation period or not is determined (S460). If the period is not counted down for the same operation period yet, the process is returned back to the step S450 to continue counting value and period. In contrary, if the period has been counted down for the same operation period, the next step of reading the value counted under the condition of the reference capacitor 160 being connected with the sensing capacitor 170 is performed (S470), so as to detect corresponding voltage variations of the input 114 of the oscillator 110.

According to the foregoing embodiments, when the reference capacitor 160 is disconnected with the sensing capacitor 170, a first value can be counted up to a second value. In contrary, when the reference capacitor 160 is connected with the sensing capacitor 170, the second value can be counted down to a third value, in which the third value can be equal to or larger than the first value. Furthermore, since the period or frequency of the oscillation signal RCLK may vary along with the capacitances of the reference capacitor 160 and the sensing capacitor 170 and the value of the current IS, the third value may increase correspondingly when the capacitance of the sensing capacitor 170, generated along with the touch sensing operation, increases. In addition, when users perform touch sensing operation such that the effective capacitance CS of the sensing capacitor 170 is generated and corresponding capacitance variations are generated, corresponding capacitance or voltage variations can be detected by reading the counted values, and then execution programs corresponding to the touch sensing operation are further performed in accordance with the capacitance or voltage variations.

A conventional capacitive sensing device needs two or more than two oscillators cooperated with each other, and thus the variation of sensed capacitance can be detected according to the frequency difference between the generated signals, to further sense the user's touch. However, in the embodiments of present invention, only a single oscillator cooperating with the timer and the counter is necessary in order to sense the user's touch and the variation of sensed capacitance. Thus, there will be no need to use precisely designed pre-stage analog circuit, and there will be no different detection result caused by the affect of temperature, voltage or other environmental factors when multiple oscillators cooperate with each other.

Furthermore, since the foregoing embodiments of the present invention are provided to observe if there is any variation of the capacitance or voltage in accordance with the variation of the values, corresponding variations of the capacitance or voltage can be detected, and the detection result can thus be determined, by reading the counted value only, so that it is more convenient for the following circuits to perform the corresponding procedures and processes.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. A sensing device comprising:
    an oscillator comprising an input and an output, the input being coupled to a reference capacitor;
    a driver coupled to the reference capacitor, and input and the output of the oscillator, the driver alternately sourcing and sinking current in accordance with an oscillation signal outputted by the oscillator;
    a switch disposed between the reference capacitor and a sensing capacitor and configured to connect or disconnect the reference capacitor with the sensing capacitor;
    a counter coupled to the output of the oscillator and configured to count value for the oscillation signal; and
    a timer coupled to the counter and configured to count operation periods respectively when the switch connecting the reference capacitor with the sensing capacitor and when the switch disconnecting the reference capacitor with the sensing capacitor, the counter being configured to count values corresponding to conditions of the switch connecting and disconnecting the reference capacitor with the sensing capacitor during the operation periods, respectively.

2. The sensing device as claimed in claim 1, wherein when the switch disconnects the reference capacitor with the sensing capacitor, the counter counts from a first value up to a second value during the operation period, and when the switch connects the reference capacitor with the sensing capacitor, the counter counts from the second value down to a third value during the operation period.

3. The sensing device as claimed in claim 2, wherein the third value is equal to or larger than the first value.

4. The sensing device as claimed in claim 2, wherein the third value increases correspondingly when capacitance of the sensing capacitor increases.

5. The sensing device as claimed in claim 1, wherein the timer counts up the operation period in accordance with the value counted by the counter when the switch disconnects the reference capacitor with the sensing capacitor.

6. The sensing device as claimed in claim 5, wherein the operation period counted up by the timer is an elapsed period of the counter counting from 0 up to a maximum value.

7. The sensing device as claimed in claim 5, wherein the counter counts down based on the operation period.

8. The sensing device as claimed in claim 1, further comprising:
    a control unit coupled to the counter and the timer, the control unit being configured to read the value corresponding to the condition of the switch connecting the reference capacitor with the sensing capacitor during the operation period, counted by the counter, to detect corresponding voltage variations of the input of the oscillator to determine variations of the conditions of the reference capacitor being connected and disconnected with the sensing capacitor.

9. The sensing device as claimed in claim 8, wherein the control unit is further configured to control the timer to count up the operation period in accordance with the value counted by the counter and configured to control the counter to count down based on the operation period.

10. The sensing device as claimed in claim 8, wherein the control unit is further configured to set a maximum countable value of the counter and a maximum countable period of the timer.

11. A sensing method used in a sensing device, the sensing device comprising an oscillator and a driver, an input of the oscillator being coupled to a reference capacitor, the driver being coupled to the reference capacitor and an output of the oscillator and alternately sourcing and sinking current in accordance with an oscillation signal outputted by the oscillator, the sensing method comprising:
  disconnecting the reference capacitor with a sensing capacitor;
  counting value for the oscillation signal under the condition of the reference capacitor being disconnected with the sensing capacitor;
  counting time period while counting value for the oscillation signal, to obtain an operation period;
  connecting the reference capacitor with the sensing capacitor after the operation period being obtained;
  counting value for the oscillation signal during the operation period under the condition of the reference capacitor being connected with the sensing capacitor; and
  reading a value counted under the condition of the reference capacitor being connected with the sensing capacitor during the operation period to detect corresponding voltage variations of the input of the oscillator to determine variations of the conditions of the reference capacitor being connected and disconnected with the sensing capacitor.

12. The sensing method as claimed in claim 11, wherein the step of counting time period while counting value for the oscillation signal further comprises:
  counting up time period in accordance with the counted value.

13. The sensing method as claimed in claim 12, wherein the operation period obtained by counting up time period is an elapsed period of counting from 0 up to a maximum value.

14. The sensing method as claimed in claim 12, wherein the step of counting value for the oscillation signal during the operation period further comprises:
  counting down the operation period and counting down a value based on the operation period.

15. The sensing method as claimed in claim 11, wherein the step of counting value for the oscillation signal under the condition of the reference capacitor being disconnected with the sensing capacitor comprises counting from a first value up to a second value, the step of counting value for the oscillation signal under the condition of the reference capacitor being connected with the sensing capacitor comprises counting from the second value down to a third value, and the third value is equal to or larger than the first value.

16. The sensing method as claimed in claim 15, wherein the third value increases correspondingly when capacitance of the sensing capacitor increases.

* * * * *